United States Patent [19]
Hsu

[11] Patent Number: 6,087,251
[45] Date of Patent: Jul. 11, 2000

[54] METHOD OF FABRICATING A DUAL DAMASCENE STRUCTURE

[75] Inventor: Chen-Chung Hsu, Taichung, Taiwan

[73] Assignee: United Microelectronics Corp., Hsinchu, Taiwan

[21] Appl. No.: 09/183,293

[22] Filed: Oct. 30, 1998

[51] Int. Cl.[7] .............................................. H01L 21/4763
[52] U.S. Cl. ..................... 438/618; 438/702; 438/637; 438/638
[58] Field of Search ................... 438/637, 638, 438/674, 672, 702

[56] References Cited

U.S. PATENT DOCUMENTS

| | | | |
|---|---|---|---|
| 5,187,121 | 2/1993 | Cote et al. | 438/645 |
| 5,382,545 | 1/1995 | Hong | 438/624 |
| 5,677,243 | 10/1997 | Oshaki | 438/638 |
| 5,693,568 | 12/1997 | Liu et al. | 438/618 |
| 5,767,012 | 6/1998 | Fulford, Jr. et al. | 438/622 |

*Primary Examiner*—Caridad Everhart
*Attorney, Agent, or Firm*—Hickman Stephens Coleman & Hughes, LLP

[57] ABSTRACT

A method for manufacturing a dual damascene structure comprises the following steps. First, a first insulator having a first trench and a second trench therein is formed on a substrate. A first conductive line and a second conductive line are formed in the first trench and the second trench, respectively. A shielding layer is formed on the first conductive line. The upper part of the second conductive line is removed to form a third trench in the first insulator. The shielding layer is removed. A second insulator is formed on the first insulator and thoroughly fills the third trench. Part of the second insulator is removed until the first conductive line is exposed. A dielectric layer is formed on the second insulator and the first conductive line. The dielectric layer is patterned to form a fourth trench and to expose the first conductive line. Finally, a third conductive line is formed in the fourth trench to electrically connect the first conductive line.

19 Claims, 6 Drawing Sheets

METHOD OF FABRICATING A DUAL DAMASCENE STRUCTURE

BACKGROUND OF THE INVENTION

1. Field of the Invention

The invention relates to a method for manufacturing multilevel interconnects, and in particular to a method for manufacturing a dual damascene structure.

2. Description of the Prior Art

In a traditional method for manufacturing interconnects, an insulating layer, such as a silicon oxide layer, is used to isolate two patterned metal layers formed on both surfaces thereof from each other. Furthermore, via holes are formed between the patterned metal layers in the insulating layer, wherein the via holes are filled with conductive layers having material similar to or even completely different from the patterned metal layers, thereby vertically and electrically connecting the patterned metal layers. It is noted that designs having more than two metal layers are increasingly adopted in IC manufacture in line with miniaturization of ICs. Generally, the insulating layer isolating the patterned metal layers from each other is called an intermetal dielectric (IMD) layer, and the conductive layers formed inside the via holes for vertically connecting the patterned metals are called vias.

Typically, there are two prior methods for manufacturing via holes and interconnects. In the first method, an inter-metal dielectric layer is formed on a first patterned metal layer. Then, via holes are formed in the dielectric layer by photolithography and etching. Next, conductive layers, serving as vias, are formed in the via holes by deposition. Finally, a second patterned metal layer is formed on the inter-metal dielectric layer and the vias.

The other method introduces a dual damascene technique in which via holes and interconnects are formed simultaneously.

In the dual damascene technique, an insulating layer is formed on a substrate, and then planarized. Thereafter, the insulating layer is etched to form trenches and via holes based on the required pattern of a subsequently formed metal line. That is, the insulating layer is etched to form the trenches for use of subsequently formed metal lines, while also being etched, until active regions or connections in the substrate are exposed, to form the via holes. Then, a metal layer is deposited in the trenches and the via holes to form the metal lines and vias, respectively. Finally, chemical mechanical polishing (CMP) is performed for planarization. The steps described above are repeated, thereby forming another dual damascene structure.

To illustrate a method employed in the prior art, reference is made to FIGS. 1A–G. FIG. 1A shows a substrate 100 with a flat surface provided (devices formed in the substrate 100 are not shown). A conductive layer (not shown) is formed on the substrate 100 and then patterned to form metal lines 102a, 102b and 102c by photolithography and etching. At the same time, portions of the substrate 100 surface are exposed.

Referring to FIG. 1B, a first dielectric layer 104, such as a silicon oxide layer, is deposited on the substrate 100 by chemical vapor deposition (CVD). Next, the first dielectric layer 104 is polished by chemical mechanical polishing until the surfaces of the metal lines 102a, 102b and 102c are exposed.

Referring to FIG. 1C, a second dielectric layer 106, such as a silicon oxide layer, is deposited on the metal lines 102a, 102b and 102c and the first dielectric layer 104 by chemical vapor deposition, and then is planarized. The thickness of the second dielectric layer 106 is approximately equal to the depth of each subsequently formed via. Thereafter, an etching stop layer 108, such as a silicon nitride layer, is formed on the second dielectric layer 106 by chemical vapor deposition.

Referring to FIG. 1D, an opening 110 is formed in the etching stop layer 108 by photolithography and etching, such as reactive ion etching (RIE), and a portion of the second dielectric layer 106 surface is concurrently exposed. The opening 110 is directly above the metal line 102b.

As shown in FIG. 1E, a third dielectric layer 116, such as a silicon oxide layer, is formed on the etching stop layer 108 and in the opening 110 by chemical vapor deposition, and then is planarized until the thickness of the third dielectric layer 116 is approximately equal to the required depth of a subsequently-formed trench.

Referring to FIG. 1F, the third dielectric layer 116 is etched to form a trench 118a by photolithography and etching, such as reactive ion etching (RIE). Then, the third dielectric layer 106 is continuously etched until the surface of the metal line 102b is exposed, forming a via hole 118b below part of the trench 118a. In other words, due to the existence of the etching stop layer 108, a larger opening 118 formed for use in manufacturing a dual damascene structure includes the opening 118a and the via hole 118b, wherein the upper part of the larger opening 118 is wider than the lower part of the larger opening 118.

Referring to FIG. 1G, a conductive layer (not shown) is formed on the third dielectric layer 116 and in the trench 118a and the via hole 118b, and then is polished by chemical mechanical polishing until the surface of the dielectric layer 116a is exposed. As a result, a conductive line 122 is formed.

As described above the prior method for manufacturing a dual damascene structure involves a relatively complicated set of steps to form the tapered opening 118. In short, the prior method has the disadvantages of requiring an excessive number of inter-metal dielectric depositions and depositing at least one layer of etching stop. Therefore, the prior method needs more deposition steps, resulting in higher costs and greater time consumption. In addition, it is easy to cause misalignment when forming via holes by photolithography and etching.

SUMMARY OF THE INVENTION

In view of the above, an object of the invention is to provide a method for manufacturing a dual damascene structure which comprises the following steps. First, a first trench and a second trench are formed in a first insulator which is located on a substrate. A first conductive line and a second conductive line are formed in the first trench and the second trench, respectively. A shielding layer is formed on the first conductive line. The upper part of the second conductive line is removed to form a third trench. The shielding layer is removed. A second insulator is formed on the first insulator and completely fills the third trench. Part of the second insulator is removed until the first conductor line is exposed. A dielectric layer is formed on the second insulator. The dielectric layer is patterned to form a fourth trench and to expose the first conductive line. And, a third conductive line is formed in the fourth trench to electrically connect the first conductive line.

In the method of the invention, the insulators (etching stop layers) also function as dielectric layers. Furthermore, the first conductive line with a thickness approximately equal to the sum of thicknesses of a predetermined lower conductive line and via is formed in the insulators. Then, the third conductive line is formed in the dielectric layer to electrically connect the first conductive layer. Since the formed first conductive line simultaneously includes the predetermined lower conductive line and via, it is unnecessary to define an additional via hole. Therefore, the misalignment caused by the definition for the via hole in the prior art cannot be incurred.

BRIEF DESCRIPTION OF THE DRAWINGS

The present invention will be more fully understood from the detailed description given hereinbelow and the accompanying drawings which are given by way of illustration only, and thus do not limit the present invention, and wherein.

DETAILED DESCRIPTION OF THE INVENTION

FIGS. 2A–2G shows a method for manufacturing a dual damascene structure according to a preferred embodiment of the invention.

Figure 1A:
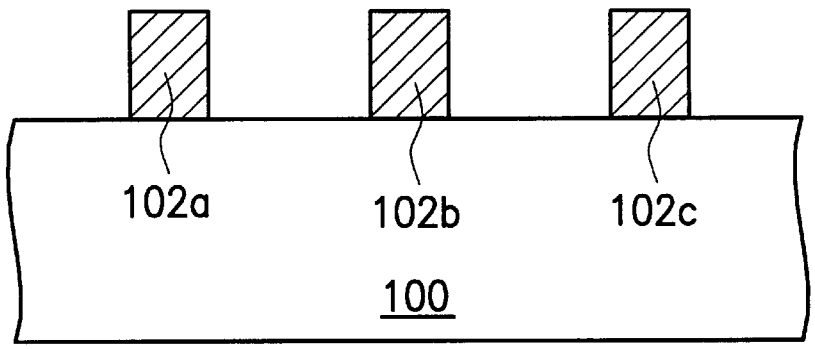
FIGS. 1A through 1G are cross-sectional views illustrating a method for manufacturing a dual damascene structure according to the prior art.
Figure 1B:
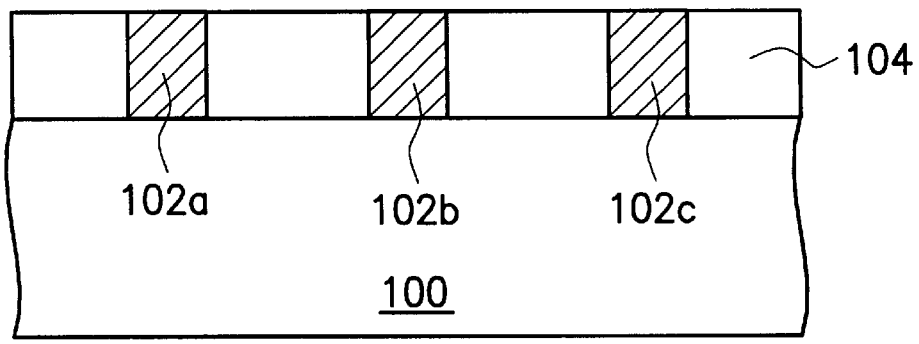
Figure 1C:
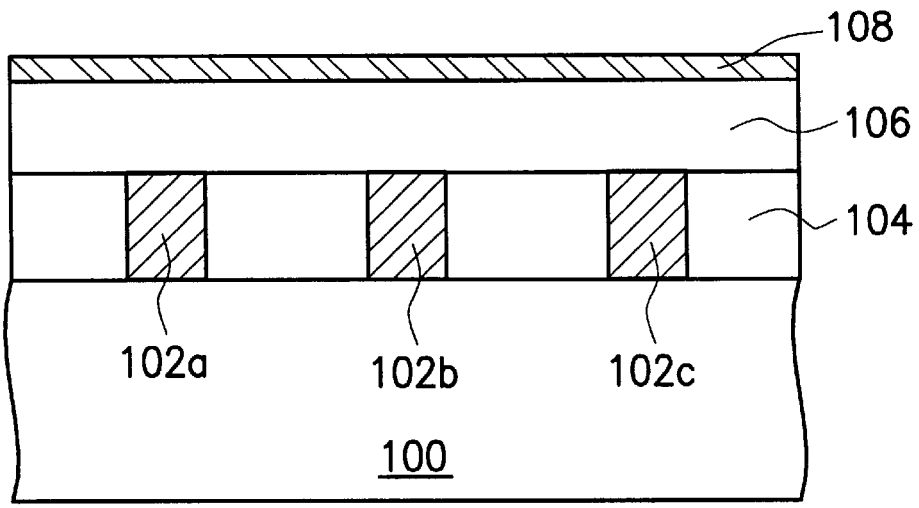
Figure 1D:
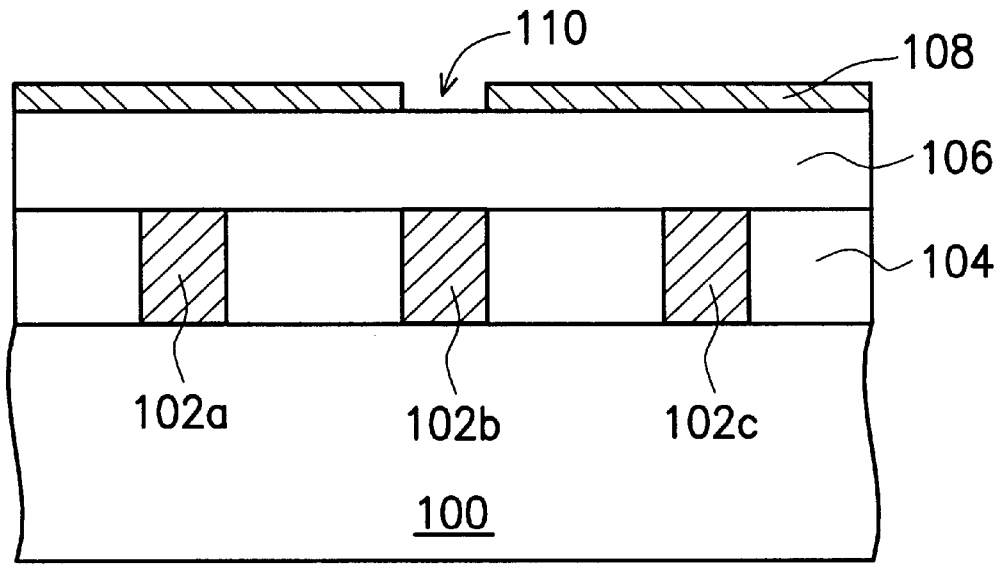
Figure 1E:
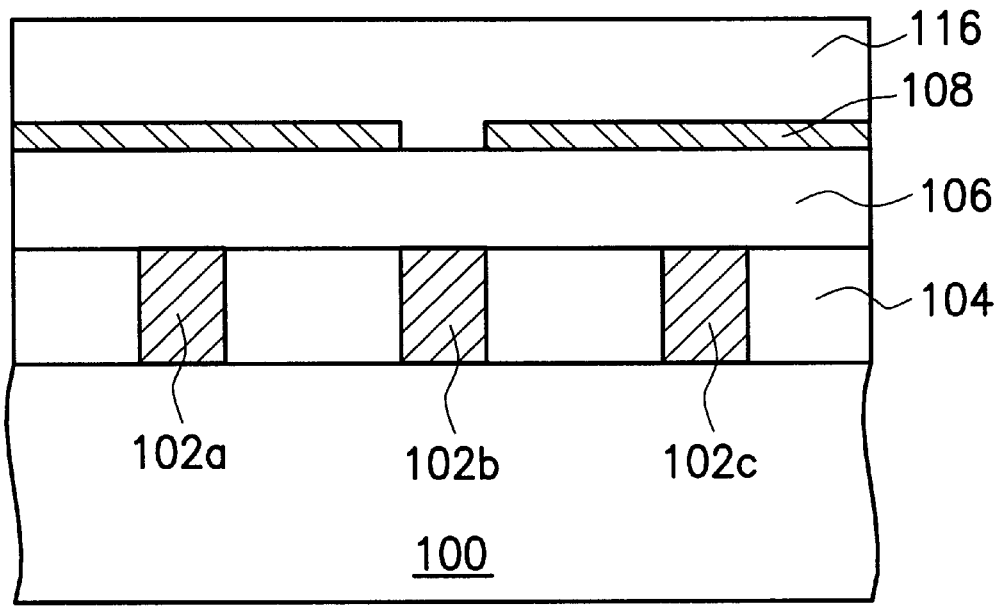
Figure 1F:
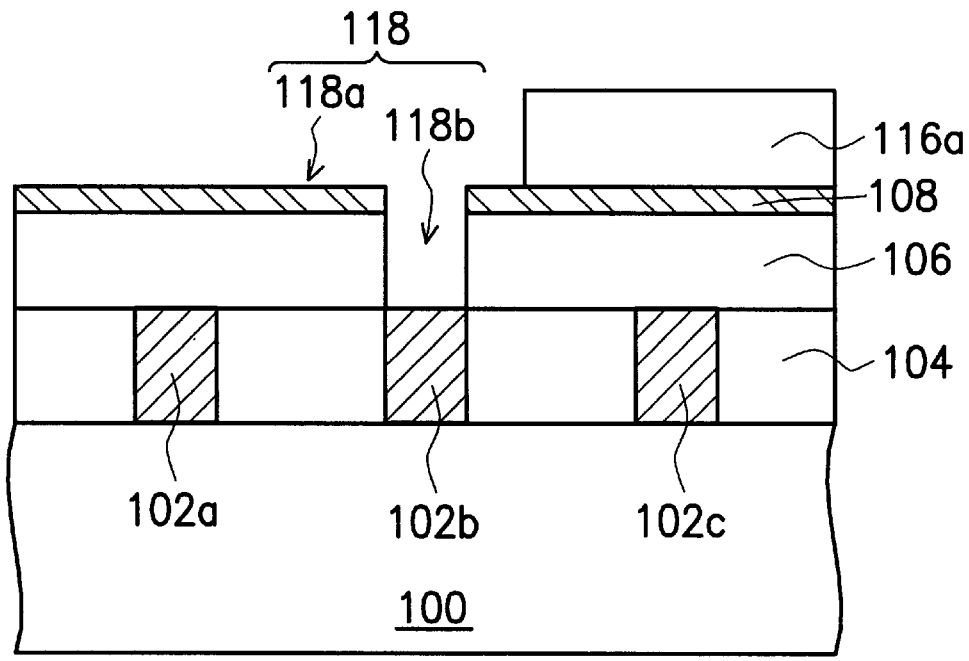
Figure 1G:
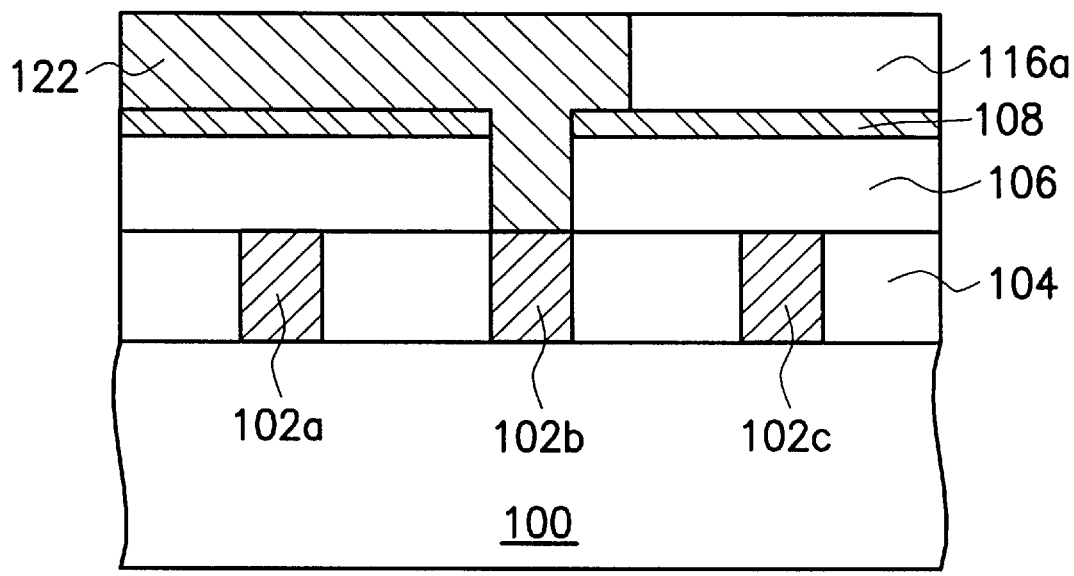
Figure 2A:
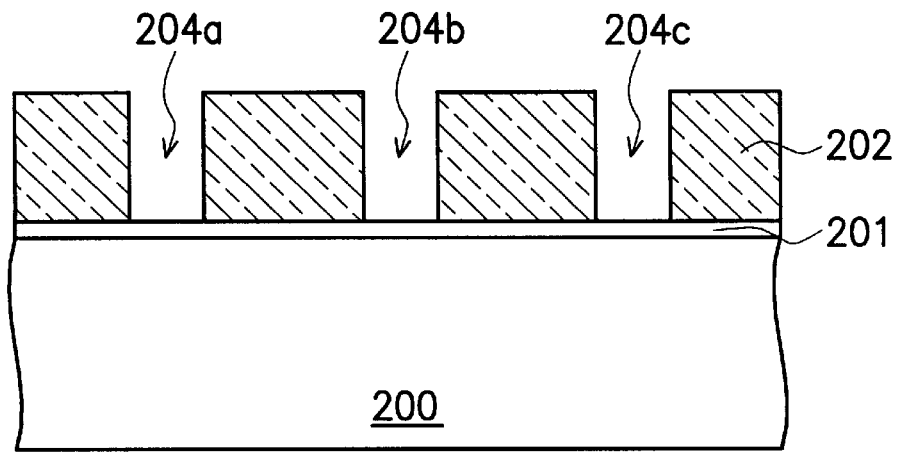
FIGS. 2A through 2G are cross-sectional views illustrating a method for manufacturing a dual damascene structure according to a preferred embodiment of the invention.

Referring to FIG. 2A, a substrate 200 with a planarized surface is first provided (devices already formed in the substrate 200 are not shown). A first inter-metal dielectric layer 201, such as a silicon oxide layer, is formed on the substrate 200 by, for example, chemical vapor deposition (CVD). Then, a first insulator 202, such as a silicon nitride layer, is formed on the first inter-metal dielectric layer 201 by, for example, chemical vapor deposition. The first insulator 202 is patterned to form trenches 204a, 204b and 204c and to expose portions of the surface of the first inter-metal dielectric layer 201 by traditional photolithography and etching.

Figure 2B:
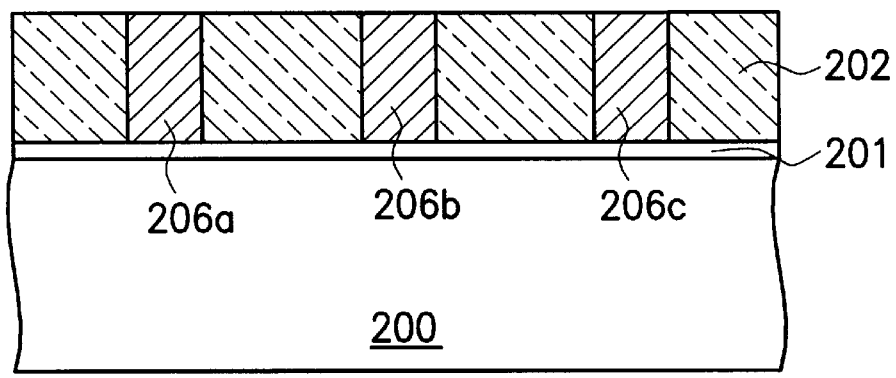

Referring to FIG. 2B, a conductive layer (not shown), such as a copper layer, an aluminum layer or an aluminum-copper alloy layer, is deposited over the substrate 200 and completely fills the trenches 204a, 204b and 204c. Part of the conductive layer over the first insulator 202 is removed to form conductive lines 206a, 206b and 206c in the trenches 204a, 204b and 204c, respectively, by, for example, chemical mechanical polishing (CMP). Furthermore, the thickness of the conductive lines 206a, 206b and 206c is approximately equal to the sum of the thicknesses of a predetermined lower conductive line and via.

Figure 2C:
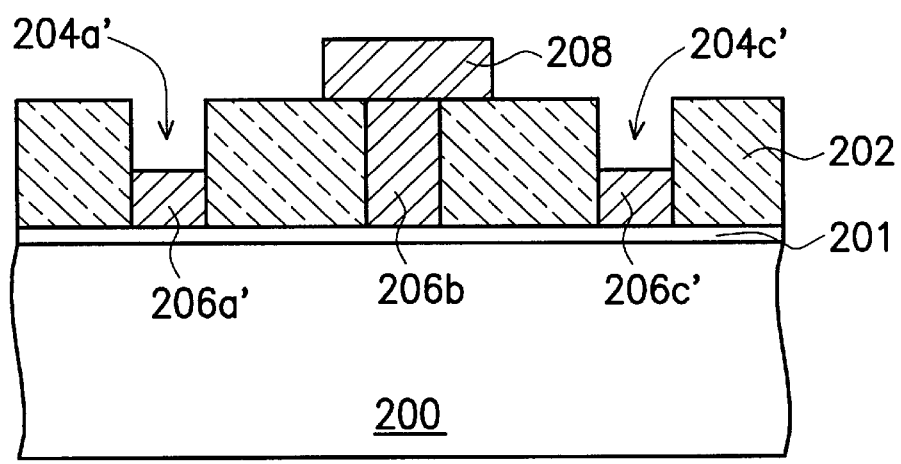

Referring to FIG. 2C, a shielding layer 208, such as a photoresist, is formed on the conductive line 206b by, for example, traditional photolithography, while the surfaces of the conductive lines 206a and 206c are still exposed.

Thereafter, the upper parts of the conductive lines 206a and 206c are removed to form trenches 204a' and 204c' in the first insulator 202 and conductive lines 206a' and 206c' by, for example, etch back. The thickness of the conductive lines 206a' and 206c' is approximately equal to that of the predetermined lower conductive line while the thickness of the conductive line 206b remains approximately equal to the sum of the thicknesses of the predetermined lower conductive line and via.

Figure 2D:
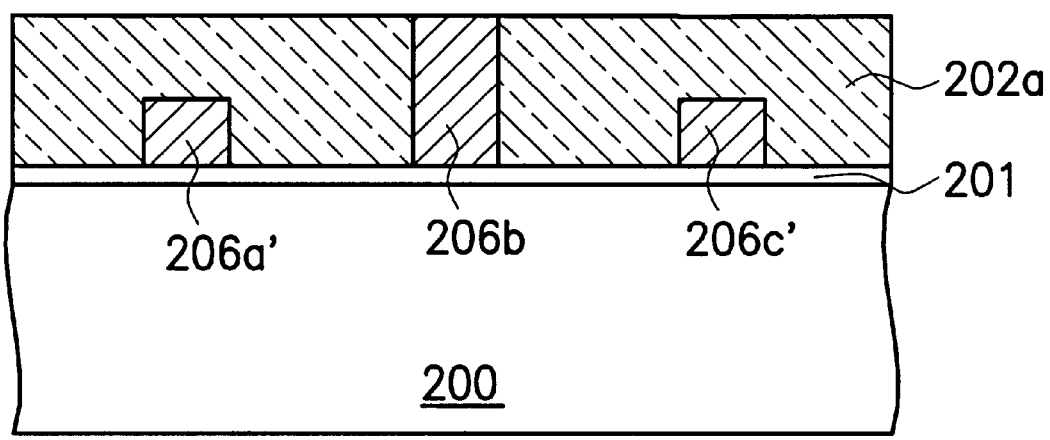

Referring to FIG. 2D, the shielding layer 208 is removed to exposed the surface of the conductive line 206b. Next, a second insulator (not shown) with the same material as the first insulator 202, such as a silicon nitride layer, is formed on the first insulator 202 and completely fills the trenches 204a' and 204c' by, for example, chemical vapor deposition. Part of the second insulator (not shown) over the level of the conductive line 206b is removed by, for example, chemical mechanical polishing to form a third insulator 202a (consisting of the first insulator 202 and the second insulator) until the surface of the conductive line 206b is exposed.

Figure 2E:
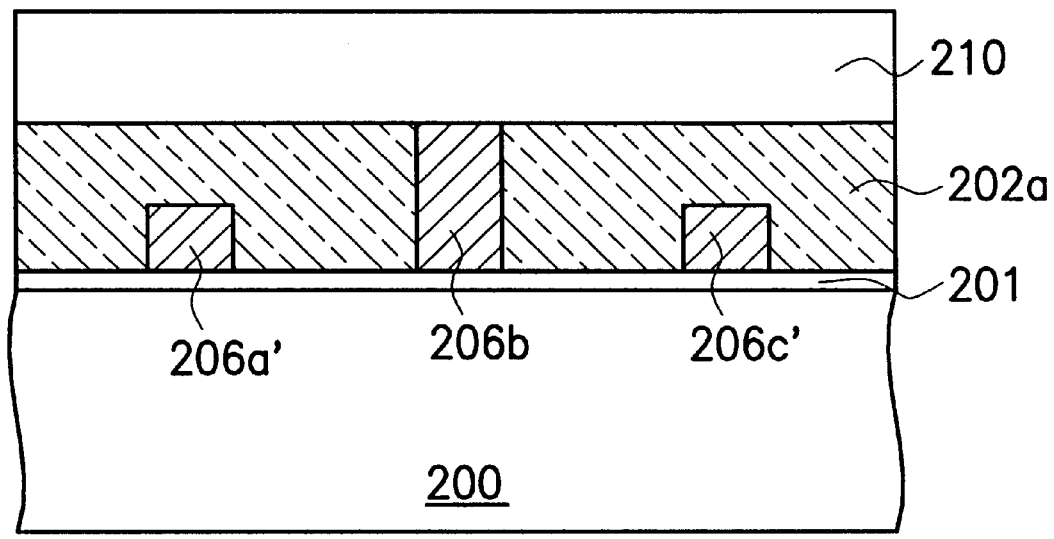

Referring to FIG. 2E, a second inter-metal dielectric layer 210, such as a silicon oxide layer, is formed on the insulator 202a and the conductive line 206b by, for example, chemical mechanical deposition and then is planarized by, for example, chemical mechanical polishing until the thickness thereof is approximately equal to that of a subsequently formed upper conductive line.

Figure 2F:
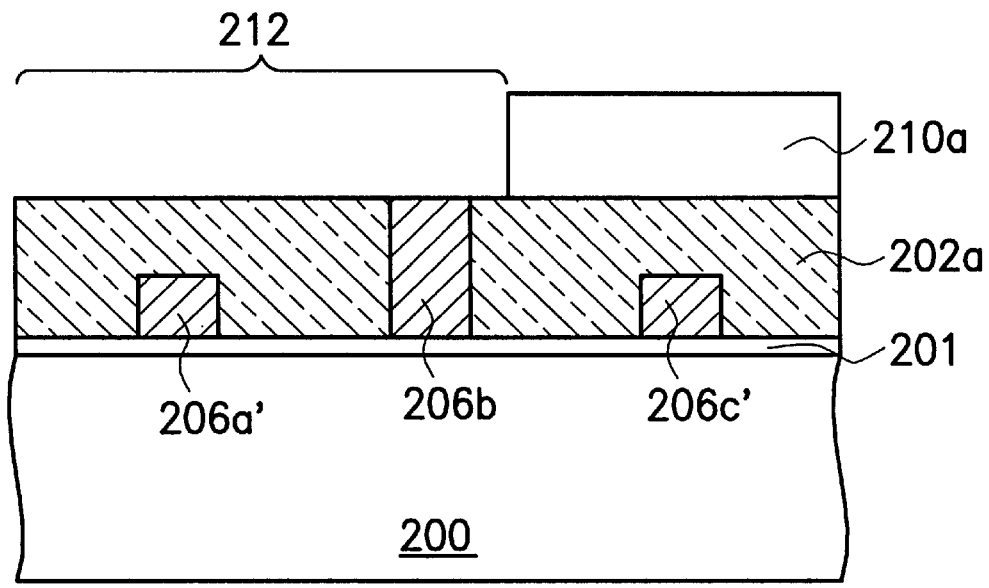

Referring to FIG. 2F, part of the second inter-metal dielectric layer 210 is removed to form a horizontal trench 212 by traditional etching, such as anisotropic etching until the surface of the third insulator 202a, functioning as an etching layer, and the surface of the conductive line 206b are exposed.

Figure 2G:
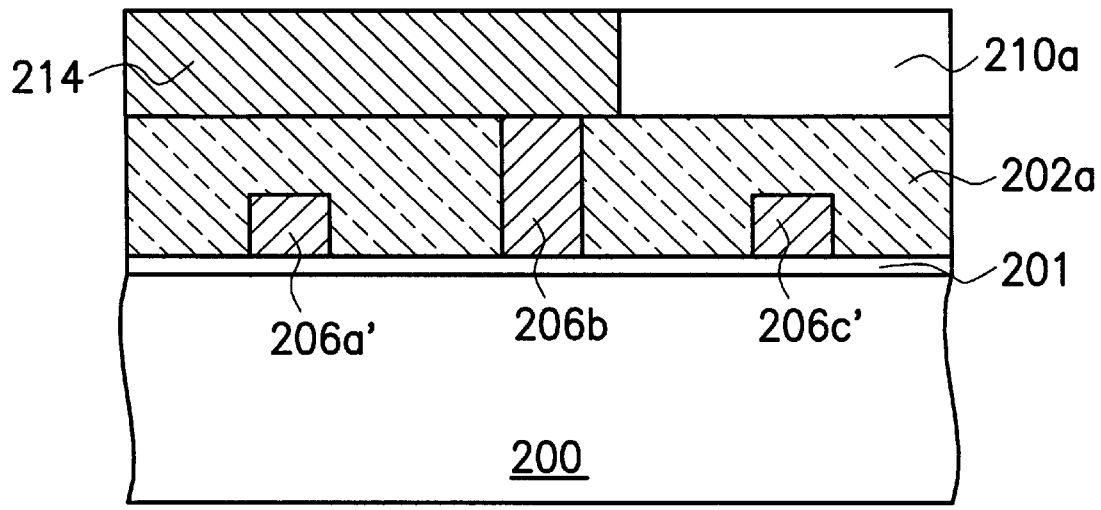

Referring to FIG. 2G, an upper conductive layer (not shown), such as a copper layer, an aluminum layer or an aluminum-copper alloy layer, is formed over the substrate 200 and completely fills the horizontal trench 212. Thereafter, part of the upper conductive layer over the level of the second inter-metal dielectric layer 210a is removed by, for example, chemical mechanical polishing, until the surface of the inter-metal dielectric layer 210a is exposed, thereby forming an upper conductive line 214 in the horizontal trench 212. In addition, the formed upper conductive line 214 is electrically coupled to the conductive line 206b.

In summary, the method for manufacturing a dual damascene structure has the following advantages.

(1) The third insulator 202a (an etching stop layer) also functions as a dielectric layer. Furthermore, the conductive line 206b with a thickness approximately equal to the sum of thicknesses of the predetermined lower conductive line and via is formed in the third insulator 202a. Then, the upper conductive line 214 is formed in the dielectric layer 210a to electrically connect the conductive layer 206b. Since the formed conductive line 206b simultaneously includes the predetermined lower conductive line and via, it is unnecessary to define an additional via hole. Therefore, the misalignment caused by the definition for the via hole in the prior art cannot be incurred.

(2) The method of the invention is compatible with all current processes in semiconductor industry.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for manufacturing a dual damascene structure, comprising:

providing a substrate;

forming a first insulator on the substrate;

forming a first trench and a second trench in the first insulator to expose parts of the substrate;

forming a first conductive line and a second conductive line in the first trench and the second trench, respectively;

forming a shielding layer on the first conductive line;

removing the upper part of the second conductive line thereby to form a third trench;

removing the shielding layer;

forming a second insulator on the first insulator, wherein the second insulator completely fills the third trench;

removing part of the second insulator until the first conductor line is exposed;

forming a dielectric layer on the second insulator;

patterning the dielectric layer to form a fourth trench thereby to expose the first conductive line; and forming a third conductive line in the fourth trench, wherein the third conductive line is electrically coupled to the first conductive line.

2. The method of claim 1, wherein the first insulator layer comprises a silicon nitride layer.

3. The method of claim 1, wherein the materials used to form the first conductive line and the second conductive line are selected from a group consisting of copper, aluminum and aluminum-alloy.

4. The method of claim 1, wherein the shielding layer is a photoresist.

5. The method of claim 1, wherein the method of removing part of the second conductive line comprises etch back.

6. The method of claim 1, wherein the second insulator comprises a silicon nitride layer.

7. The method of claim 1, wherein the method of removing part of the second insulator comprises chemical mechanical polishing.

8. The method of claim 1, wherein the dielectric layer is a silicon oxide layer.

9. The method of claim 1, wherein the material used to form the third conductive line is selected from a group consisting of copper, aluminum and aluminum-copper alloy.

10. A method for manufacturing a dual damascene structure, comprising:

providing a substrate;

forming a first insulator on the substrate having a first trench and a second trench formed therein;

forming a first conductive line and a second conductive line in the first trench and the second trench, respectively;

removing the upper part of the second conductive line to form a third trench;

forming a second insulator on the first insulator, wherein the second insulator completely fills the third trench;

removing part of the second insulator until the first conductive line is exposed;

forming a dielectric layer on the second insulator;

patterning the dielectric layer to form a fourth trench thereby to expose the first conductive line; and forming a third conductive line in the fourth trench, wherein the third conductive line is electrically coupled to the first conductive line.

11. The method of claim 10, wherein the first insulator comprises a silicon nitride layer.

12. The method of claim 10, wherein the materials used to form the first conductive line and the second conductive line are selected from a group consisting of copper, aluminum and aluminum-copper alloy.

13. The method of claim 10, wherein the method of removing part of the second conductive line comprises etch back.

14. The method of claim 10, further comprising forming a shielding layer on the first conductive line before removing the upper part of the second conductive line, and removing the shielding layer after removing the upper part of the second conductive line.

15. The method of claim 14, wherein the shielding layer is a photoresist.

16. The method of claim 10, wherein the second insulator comprises a silicon nitride layer.

17. The method of claim 10, wherein the method of removing part of the second insulator comprises chemical mechanical polishing.

18. The method of claim 10, wherein the dielectric layer comprises a silicon oxide layer.

19. The method of claim 10, wherein the material used to form the third conductive line is selected form a group consisting of copper, aluminum and aluminum-copper alloy.

* * * * *